(12) United States Patent
Brusaw et al.

(10) Patent No.: US 8,907,202 B1
(45) Date of Patent: Dec. 9, 2014

(54) METHOD AND SYSTEM FOR COLLECTING, STORING AND DISTRIBUTING SOLAR ENERGY USING NETWORKED TRAFFICABLE SOLAR PANELS

(76) Inventors: Scott David Brusaw, Sagle, ID (US);
Julie A. Brusaw, Sagle, ID (US)

( * ) Notice: Subject to any disclaimer, the term of this patent is extended or adjusted under 35 U.S.C. 154(b) by 725 days.

(21) Appl. No.: 12/800,060

(22) Filed: May 7, 2010

Related U.S. Application Data

(60) Provisional application No. 61/215,524, filed on May 7, 2009.

(51) Int. Cl.
*H01L 31/042* (2014.01)
(52) U.S. Cl.
USPC ........... 136/244; 136/251; 136/291; 136/293; 362/153.1; 362/183; 362/234; 404/71
(58) Field of Classification Search
USPC .......... 136/243–265; 404/71; 362/145, 153.1, 362/183, 243
See application file for complete search history.

(56) References Cited

U.S. PATENT DOCUMENTS

| | | | | |
|---|---|---|---|---|
| 4,132,074 | A * | 1/1979 | Wendel | 60/641.8 |
| 6,355,875 | B1 * | 3/2002 | Kamimura | 136/256 |
| 6,932,489 | B2 * | 8/2005 | Sooferian | 362/145 |
| 7,160,049 | B2 | 1/2007 | Saito et al. | |
| 7,162,833 | B2 * | 1/2007 | Faris | 47/58.1 LS |
| 7,484,907 | B2 | 2/2009 | Yang | |
| 7,495,351 | B2 | 2/2009 | Fein et al. | |
| 7,501,713 | B2 | 3/2009 | Fein et al. | |
| 2002/0121298 | A1 * | 9/2002 | Konold | 136/248 |
| 2003/0070706 | A1 * | 4/2003 | Fujioka | 136/251 |
| 2003/0137831 | A1 * | 7/2003 | Lin | 362/183 |
| 2005/0199282 | A1 | 9/2005 | Oleinick et al. | |

(Continued)

FOREIGN PATENT DOCUMENTS

DE 3101913 9/1982
EP 1401026 * 3/2004

(Continued)

OTHER PUBLICATIONS

Biello, David. Driving on Glass? Inventor Hopes to Lay Down Solar Roads: U.S. roads paved with glass panels encasing photovoltaics and LEDs would double as a national power grid. Oct. 6, 2009. Scientific American. <http://www.scientificamerican.com/article.cfm?id=driving-on-glass-solar-roads> Retrieved Apr. 18, 2012.*

(Continued)

*Primary Examiner* — James Lin
*Assistant Examiner* — Liesl C Baumann
(74) *Attorney, Agent, or Firm* — William Andrew Jeckle

(57) ABSTRACT

A system and method for generating electricity using networked traffic bearing solar panels. A plurality of networked solar roadway panels, each formed of an upper surface layer, medial electronics layer and lower base, are sufficiently strong to support vehicular and pedestrian traffic directly thereon. Each panel carries plural photovoltaic cells, plural light emitting diodes, a heating element, a controller and related circuitry, and communicates with an energy storage device. The plurality of solar roadway panels operatively communicate with an external electrical grid and with a communication grid. The trafficable panels generate power, self-heat, provide communication links and channel storm water run-off to a storm water collection system. This system provides a self-healing, decentralized smart grid intelligent traffic bearing system.

14 Claims, 8 Drawing Sheets

(56) References Cited

U.S. PATENT DOCUMENTS

2005/0274410 A1* 12/2005 Yuuki et al. .................. 136/251
2007/0217864 A1* 9/2007 Yang .............................. 404/12
2010/0126549 A1* 5/2010 Ryu ............................. 136/244

FOREIGN PATENT DOCUMENTS

| JP | 7073395 | | 3/1995 |
| JP | 9018041 | | 1/1997 |
| JP | 2002118279 | | 4/2002 |
| JP | 2007172246 | | 7/2007 |
| WO | WO 2008018672 A1 | * | 2/2008 |
| WO | WO2008150317 | * | 12/2008 |

OTHER PUBLICATIONS

Patterson, Thom. Solar-powered 'smart' roads could zap snow, ice. Jan. 19, 2011. CNN. <http://www.cnn.com/2011/TECH/innovation/01/19/smart.roads/index.html> Retrieved Apr. 18, 2012.*

Ted Pella, Inc. "Hardness Tables." Web-site captured on Jul. 18, 2006. http://web.archive.org/web/20060718185045/http://www.tedpella.com/company_html/hardness.htm.*

United Stated Department of Transportation Contract No. DTRT57-09-C-10041.

United Stated Department of Transportation Contract No. DTRT57-09-C-10041, 2009.

* cited by examiner

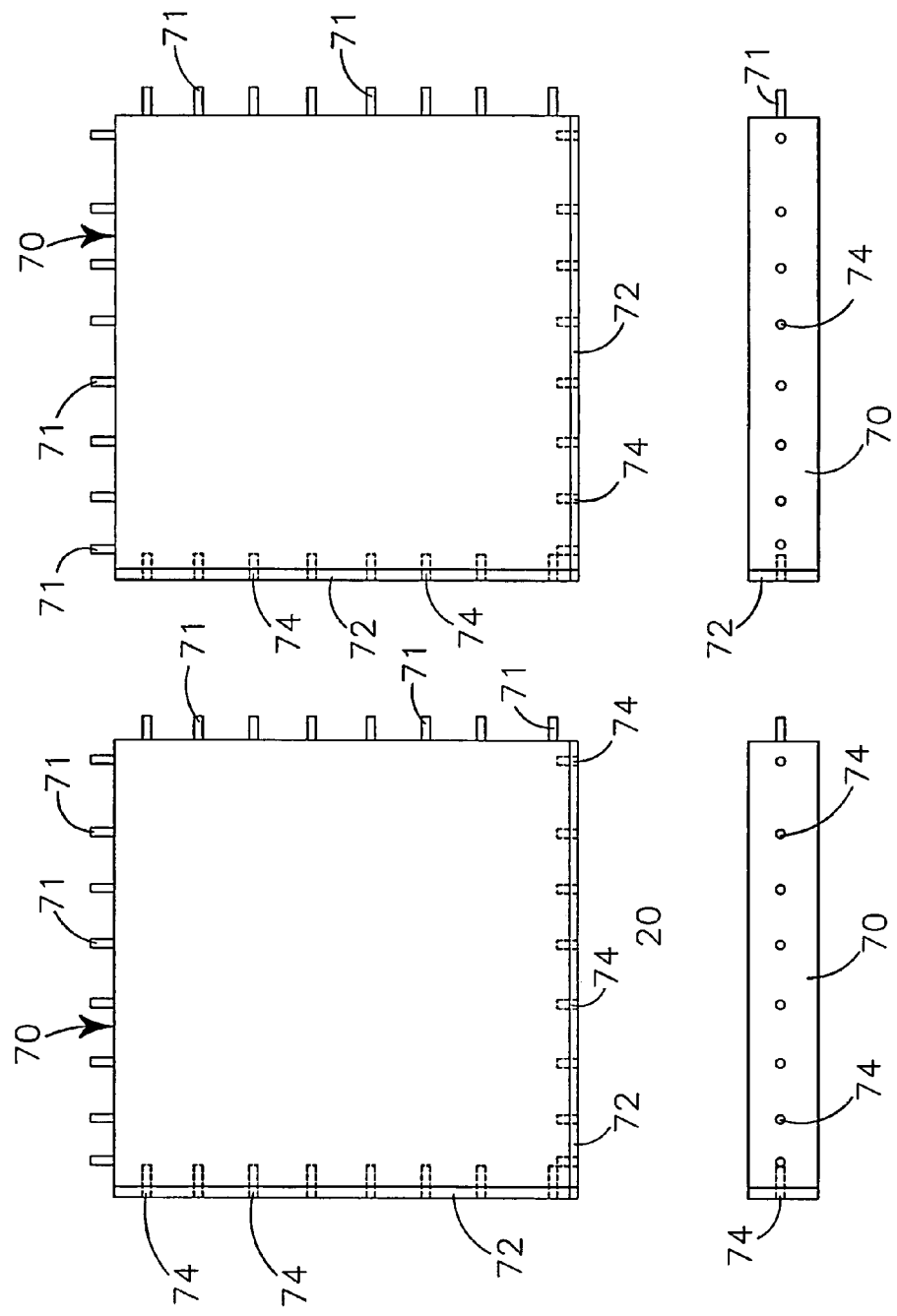

METHOD AND SYSTEM FOR COLLECTING, STORING AND DISTRIBUTING SOLAR ENERGY USING NETWORKED TRAFFICABLE SOLAR PANELS

RELATED APPLICATIONS

This application claims the benefit of U.S. Provisional Patent Application No. 61/215,524, filed on May 7, 2009, the entire teachings of which are incorporated herein by this reference.

BACKGROUND OF INVENTION

1. Field of Invention

This invention relates to a method and system for electricity generation, and more particularly to a modular system of traffic supporting roadway panels for collecting solar energy, converting the solar energy into grid-ready electricity, and distributing the electrical energy.

2. Background and Description of Prior Art

It is well know that electricity may be derived from photovoltaic systems made of solar panels formed from silicone and the like that collect solar energy. A plurality of solar panels is generally referred to as a solar "array" which, by definition is larger than a solar panel, and correspondently has an ability to collect more solar energy and generate more electrical energy.

Solar energy is generally harnessed in two ways. Thermal solar energy typically uses dark colored surfaces to collect heat from sunlight, and then transfers the heat energy, via liquids, to a location where it can be used. This system is common in heating swimming pools. The second method uses photovoltaic cells that employ semi-conductor materials that translate photon energy within sunlight to direct current (DC) electrical energy.

A typical solar energy cell is solid state device in which a junction is formed between adjacent layers of semi-conductor materials. When photons strike the semi-conductor, electrons are dislodged. These dislodged electrons, which are collected by the electric field at the junction, create a voltage that can be put to work in an external circuit. The basic scientific principals that underlie generation of electricity using solar cells are well-known and understood to those skilled in the art.

Solar power generation is one method of generating clean energy. However, even though the cost of solar power systems has decreased in recent years, while at the same time the efficiency of such systems has improved, there remains a lack of a cohesive integrated infrastructure that uses solar energy as a power source.

Instead, solar energy is typically employed in small scale isolated instances. This lack of a cohesive infrastructure is one contributing factor to the fact that presently, solar power is estimated to generate less than approximately five percent (5%) of the energy consumed in the United States.

Further, it is known to use inverters and the like to add excess electricity generated by solar arrays back into a community's electrical grid.

However, there are also problems associated with solar arrays that are found mostly in roof based installations. Individually mounted solar panels on roofs are relatively expensive and such panels are often unsightly. Further, many times there is limited space on a rooftop for installation of an effective array. More fundamentally, however, individual systems for individual houses and structures, as well as installing the associated infrastructure, is inefficient and costly. Many areas of high electricity use have limited roof space and have limited unused ground space in which the relatively large solar arrays may be installed. Thus, the limited available space on buildings and many urban and suburban areas for placement of panels generally would not generate sufficient electricity to make such a system economically viable.

Further, some residential, commercial, community and governmental customers find the appearance of such solar panels on roofs unappealing and unattractive. In some locals, local regulations and covenants may prohibit installation of such panels.

Finally, selling and installation of solar panels to individual commercial and residential customers is inefficient, and adoption in the United States has been slow. Solar farms, which are land based operations, have increased the use of solar energy, but do not offer many of the advantages that could come from a widely distributed generation array. Further current solar arrays are typically centralized in one location making such arrays vulnerable to disruption.

What is needed is a widely distributed solar panel array that uses existing supportive surfaces that can be used for things other than only collection of energy.

Our invention resolves several of the aforementioned disadvantages of known solar arrays, and provides a system for the efficient collection of solar energy, transformation into electrical energy and distribution thereof.

In the contiguous lower 48 states, there are approximately 25,000 square miles of supportive surfaces including roads, parking lots, driveways, sidewalks and the like, not including buildings and structures. Our invention replaces current methods of building roads, parking lots and driveways, and the like, with a means for accomplishing the same end result, but with an incorporated system that collects solar energy and generates electric energy for distribution to homes, businesses, and the electrical grid throughout the nation. In short, current roadways, parking lots, and driveways are replaced by, or covered with solar panels that may be driven upon by vehicles while simultaneously generating electricity for useful purposes.

Our system is comprised of a plurality of interconnected and networked solar road panels. Each panel is comprised of three vertically adjacent layers including an upper surface layer, a middle layer, and a lower base. Each solar road panel is able to withstand various weather conditions including expansion and contraction due to thermal variations.

The upper surface layer is driven upon by a vehicle and provides good traction under various weather conditions. The upper surface maybe heated by internal heating means in cold climates to prevent ice and snow accumulation. The upper surface layer is constructed of a material that passes light to photovoltaic cells while providing sufficient strength and integrity to support vehicular and pedestrian traffic thereon.

The middle layer carries control structure that contains the electronics of the solar road panel including necessary circuitry, cabling, interconnection plates and the like.

The lower base supports both the control structure and the surface layer. The base may rest directly upon the ground surface, an existing supportive surface, or may be supported by vertical risers.

The solar roadway panels are interconnected electronically to allow electricity collected by the photovoltaic cells within a solar panel to be stored and distributed as desired. It is further envisioned that the solar road panels may be used to distribute other types of electric signals including cable TV, Internet connections, telephone information and the like.

The panels may be illuminated using embedded light emitting diodes (LED's). Illumination of selected LED's allows the user to "paint" lines and information on the roadway at desired locations by activating and deactivating selected LED's as desired for instance to widen, narrow or re-route traffic lanes as well as for displaying words such as "SLOW DOWN", "CAUTION", "DETOUR" and the like on the panels.

Each solar roadway panel contains a controller 28 with a unique identification code. Because the solar roadway panels are networked with one another and with the power and signal distribution grid, the controllers 28 may also be networked together.

During daylight hours the photovoltaic cells convert sunlight energy striking the panels into electrical energy, and store the electrical energy in large value capacitors, batteries or other known electricity storage devices as desired. The stored energy may thereafter be used to illuminate the LED's contained within the panel, or to heat the panel to prevent accumulation of snow and ice thereon, or the energy may be sent for distribution to a power grid.

A nationwide network of such solar roadway panels would, for example, allow the west coast to supply electricity to the east coast for several hours after the sun goes down on the east coast. Likewise, the east coast could theoretically generate electricity for the west coast for the first three hours of each day when the sun has risen in the east but has not done so in the west.

Research has shown that commercially available photovoltaic cells have approximately 15% efficiency; the US averages about 4 hours of peak sunlight hours per day (1460 hours per year); and one square mile of Solar Roadways would generate approximately 37.76 Mega-Watts of electricity per year.

If the approximately 25,000 square miles of roadway surfaces were replaced with Solar Road Panels, over 13,417 billion Kilowatt-hours of electricity could be generated per year.

According to the Energy Information Administration, the United States consumed just over 4,372 billion Kilowatt-hours of electricity in 2003, while the entire world (including the U.S.) used approximately 14,768 billion Kilowatt-hours of electricity total. Our system is capable of producing more than three times the total electricity usage of the entire United States.

SUMMARY

Our invention provides a method for generating electricity using networked trafficable solar panels. A plurality of networked solar roadway panels, each formed of an upper surface layer, medial electronics layer and lower base, are sufficiently strong to support vehicular and pedestrian traffic directly thereon. Each panel carries plural photovoltaic cells, plural light emitting diodes, a heating element, a controller and related circuitry, and communicates with an energy storage device. The plurality of solar roadway panels operatively communicate with an electrical grid and with a communication grid. The trafficable panels generate power, self-heat, provide communication links and channel rain run-off to a storm water collection system.

In providing such a method and system, it is:

a principle object to provide a method for generating and distributing electrical energy without use of fossil fuels.

a further object to provide a method for generating and distributing electrical energy without hydro-electric facilities.

a further object to provide a method including the steps of networking together a plurality of photovoltaic cells that make up a traffic bearing surface of a road system and electrically connecting the photovoltaic cells to an electrical grid for distribution.

a further object to reduce global warming by reducing greenhouse gasses.

a further object to provide a networked infrastructure system that supports communication and electrical distribution.

a further object to heat roadway panels to prevent accumulation of snow and ice that can be driving hazards.

a further object to illuminate selected LED's to "paint" lines and information on a roadway.

a further object to automatically adjust lane alignments.

a further object to provide an illuminated roadway.

a further object to provide a system for transferring electrical power to locations where needed.

a further object to provide a method for storing electricity.

a further object to provide a roadway system that utilizes recycled and recyclable materials.

a further object to provide a roadway surface that is releasable and modular to allow easy replacement of components.

a further object to provide a roadway system that monitors road conditions and provides appropriate information to road safety and law enforcement personnel.

a further object to provide a roadway system having safety characteristics that exceed those of existing asphalt and concrete roadways.

a further object to provide a roadway system that mitigates storm water runoff which accounts for as much as 50% of water pollution.

a further object to provide a roadway system having embedded radio frequency devices.

a further object to provide a roadway system that uses radio frequency devices to track the position and movement of vehicles thereon.

a further object to provide a roadway system having embedded cameras.

a further object to provide a roadway system having wildlife deterrent apparatus.

a still further object to provide such a method and system that is of new and novel design, of rugged and durable nature, of simple and economic manufacturer and one that is otherwise well suited to the uses and purposes for which it is intended.

Other and further objects of our invention will appear from the following specification and accompanying drawings which form a part hereof.

In carrying out the objects of our invention it is to be understood that its steps, methods, structures and features are susceptible to changes in design, arrangement and order, with only one preferred and practical embodiment of the best known mode being illustrated in the accompanying drawings and specified as is required.

BRIEF DESCRIPTIONS OF DRAWINGS

In the accompanying drawings which form a part hereof and wherein like numbers refer to similar parts throughout:

FIG. 8 is an orthographic plan view of panels showing one dowels and holes as a connecting means.

DESCRIPTION OF PREFERRED EMBODIMENT

It is to be understood that the present invention is not limited to the particular methodology, compounds, materials, manufacturing techniques, uses and applications described herein, as these may vary. It is also to be understood that the terminology used herein is used for the purposes of describing particular embodiments only, and is not intended to limit the scope of the present invention. It must be noted that as used herein and in the appended embodiments, the singular forms of "a", "an" and "the" include the plural reference unless the context clearly indicates otherwise. For example, reference to "an element" is a reference to one or more elements and includes equivalents thereof known to those skilled in the art. Similarly, a reference to "a step" or "a means" is a reference to one or more steps or means and may include sub-steps and subservient means. All conjunctions used are to be understood in the more inclusive sense possible. Thus, the word "or" should be understood as having the definition of a logical "or" rather than that of an exclusive "or" unless the context clearly necessitates otherwise. Language that may be construed to express approximation should be so understood unless the context clearly dictates otherwise.

Unless defined otherwise, all technical scientific terms used herein have the same meanings as commonly understood by one of ordinary skill in the art in which this invention belongs. Preferred methods, techniques, devices and materials are described, although any methods, techniques, devices, or materials similar or equivalent to those described herein may be used in the practice or testing of the present invention. Structures described herein are to be understood also to refer to functional equivalents of such structures. All references cited herein are incorporated by reference in their entirety.

The word "controller" when used in the context of the present invention, includes any device capable of controlling the individual components of the present invention, including but not limited to, sending data, and/or receiving data. Additionally, a controller may communicate with other controllers.

The words "electrical storage device" when used in the context of the present invention, include any device capable of storing an electric charge. The storage device may include a capacitor, or a battery, or other device storing electrical potential.

The words "communicating", "coupled", "association" and any derivation thereof relating to the interaction between the components and include both wireless and non-wireless means.

The words "sending", "receiving" and any derivation thereof include both wireless and non-wireless means.

Figure 1:
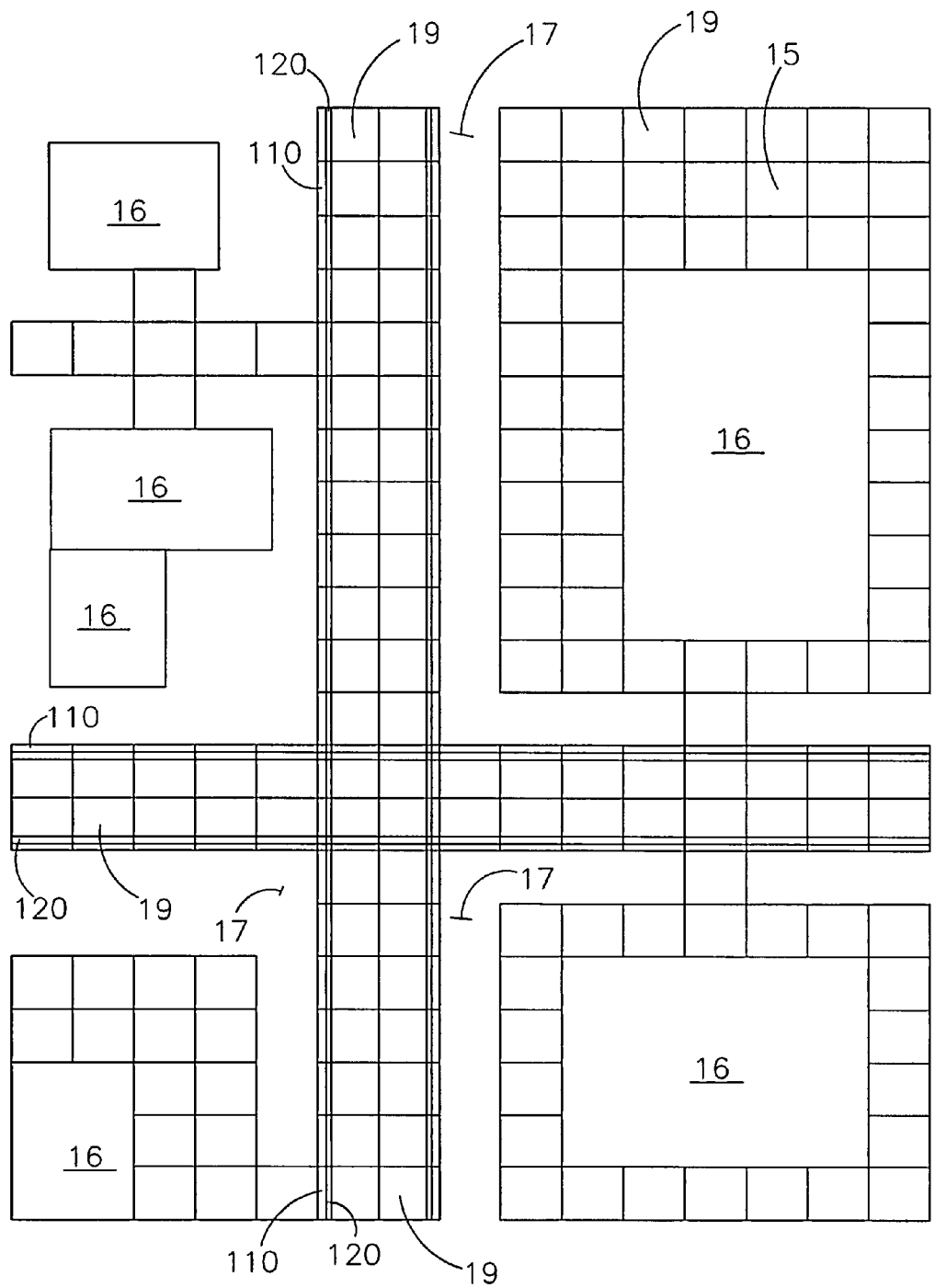
FIG. 1 is an artist's representation of a downward looking plan view of plural interconnected Solar Road Panels on roadways connecting businesses and homes via roads, parking lots and driveways.
Figure 2:
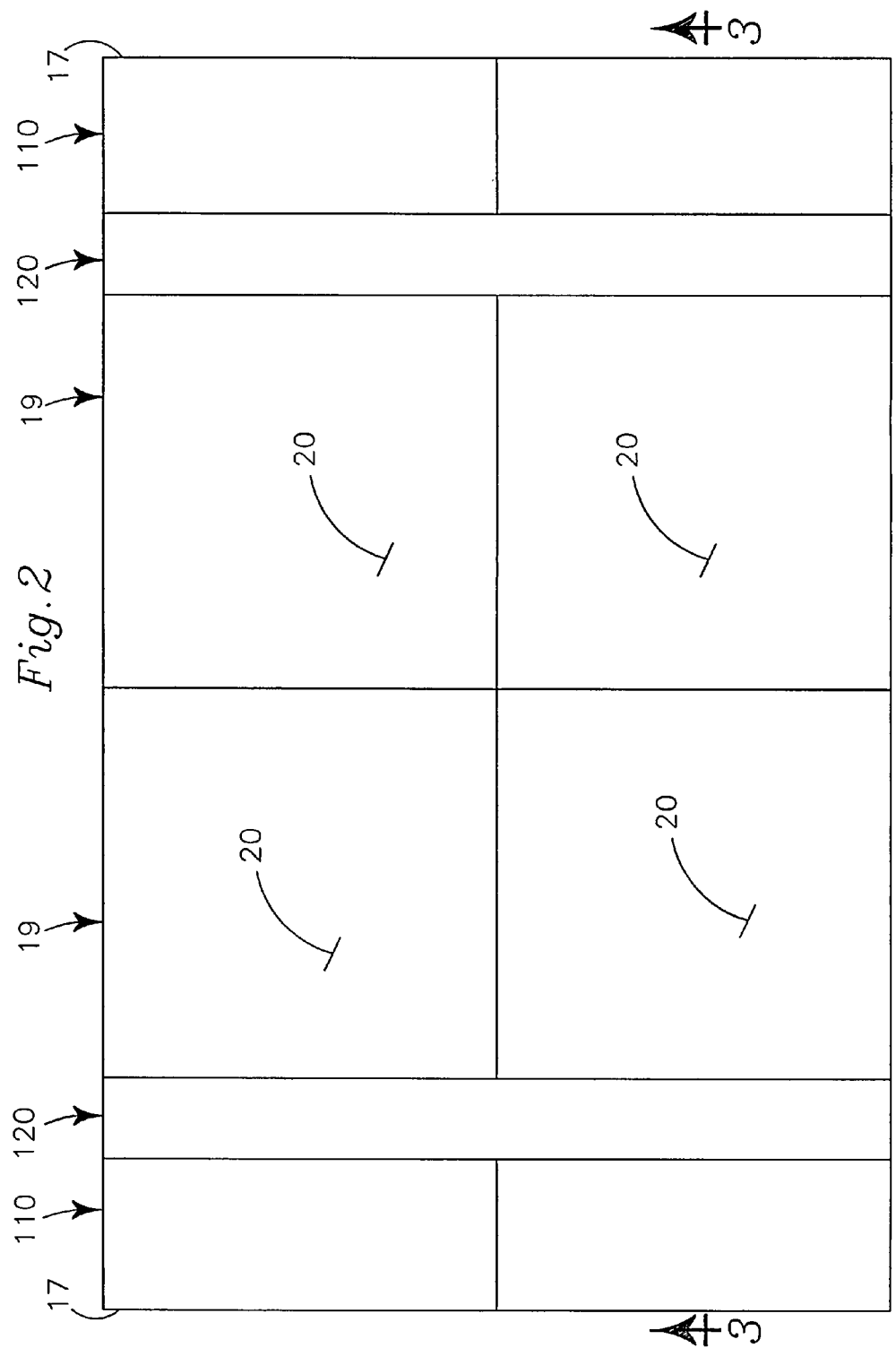
FIG. 2 is an enlarged orthographic plan view of a portion of the solar roadway of FIG. 1.

Our method and system for generating electricity using networked trafficable roadway panels, generally as seen in FIG. 1, provides plural networked solar roadway panels 19 that form a trafficable road system that may extend about buildings 16 and include parking lots 15 and the like. Each solar panel 19 comprises a surface layer 20, a medial electronics layer 60 and a supporting base 70. The three layers 20, 60, 70 are joined together with a known water-tight and debris tight seal (not shown) to prevent contaminant penetration, electrical shorts, and the like.

Figure 4:
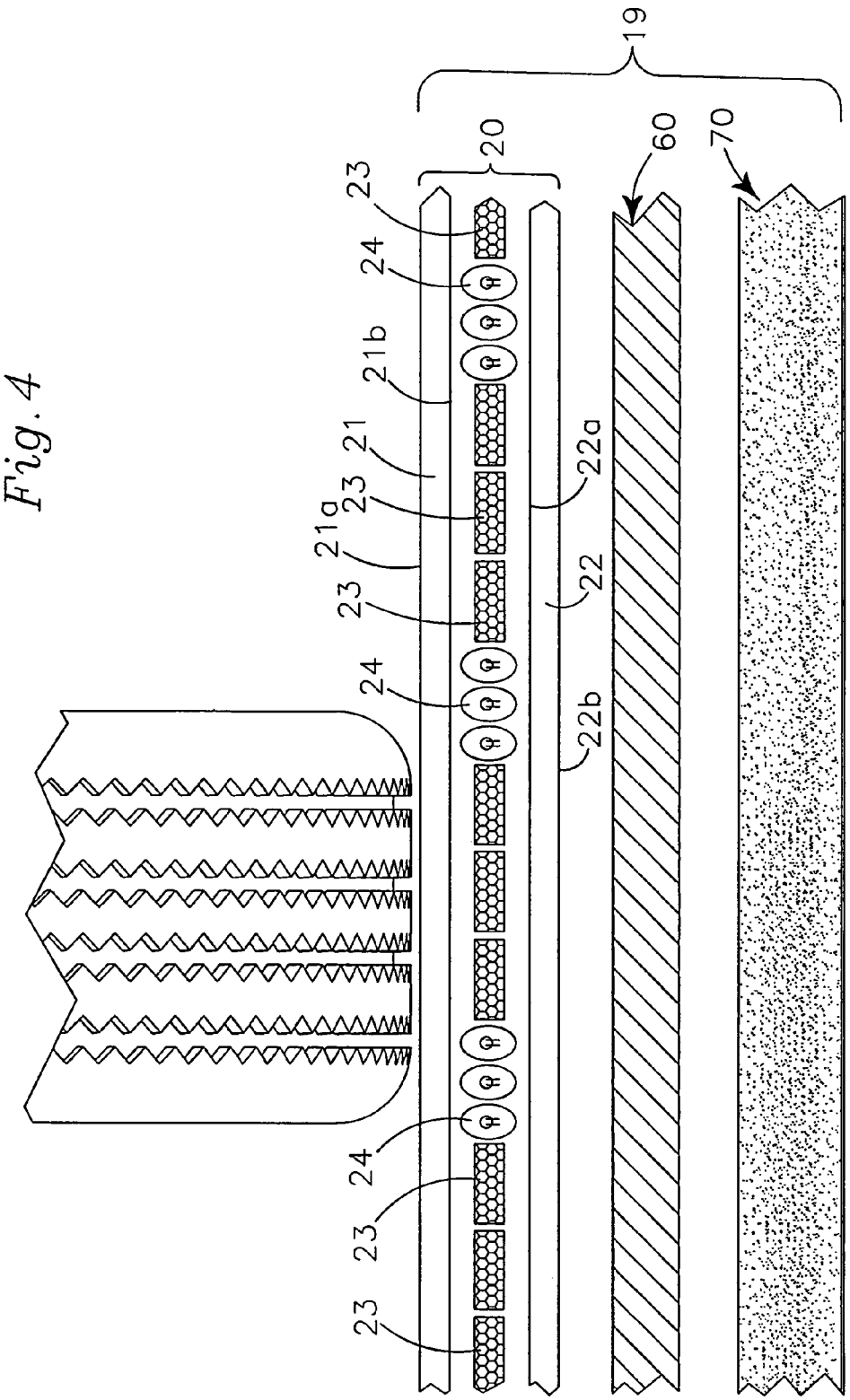
FIG. 4 is a partial enlarged orthographic cross-section view of a solar roadway panel of FIG. 3 showing a vehicle tire thereon.
Figure 5:
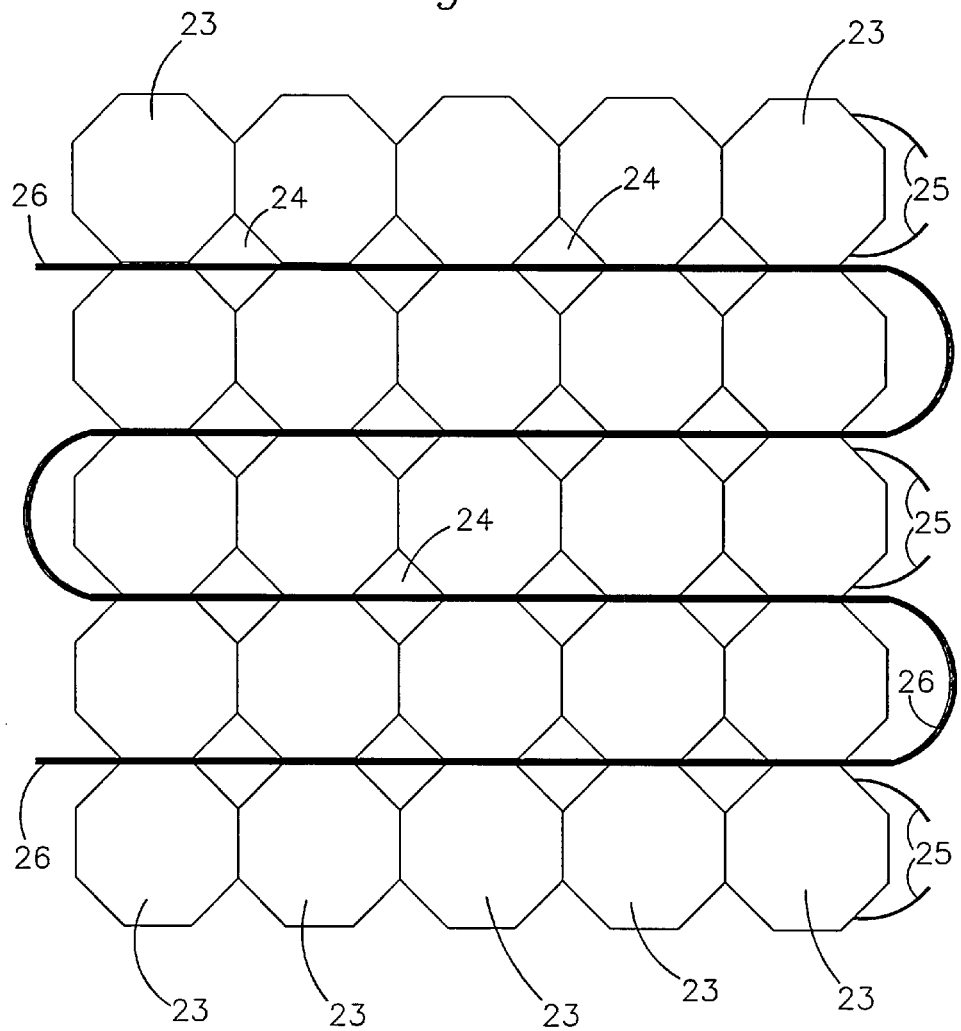
FIG. 5 is an enlarged orthographic plan view of a panel showing the plural photovoltaic cells, LEDs heat element and circuitry.

As shown in FIG. 4, surface layer 20, in the preferred embodiment, is comprised of a first upper glass panel 21 and a second lower glass panel 22. The first upper glass panel 21 has a top surface 21a and an opposing bottom surface 21b. Similarly, the second lower glass panel 22 has a top surface 22a and a bottom surface 22b.

The surface layer 20 serves multiple purposes including being the contact surface for a vehicle's tires or a pedestrian's feet, as well as providing an optically transparent interface for the underlying electronics layer and 60. It is essential that the surface layer 20 satisfy the requirements of optical transparency, mechanical reliability, weather resistance, wear resistance, durability and traction, as well as other known requirements.

The surface layer 20 must be capable of passing solar light to the underlying photovoltaic cells 23 which are positioned between the first upper glass panel 21 and the second lower glass panel 22. The surface layer 20 must also maintain the strength integrity required for supporting vehicles, and must provide waterproof protection to the medial electronics layer 60.

The required transparency of the surface layer 20 is necessary for the inward passing of solar energy to the underlying photovoltaic cells 23 and also for the outward passage of visible light from the light emitting diodes 24 between the first upper glass panel 21 and the lower glass panel 22 and spacedly arrayed about the photovoltaic cells 23.

In the preferred embodiment, glass is the material of choice because the optical properties of glass, in contrast to plastics, are stable against solarization (long term darkening) and other ultra-violet light induced mechanisms of material degradation. In addition, glass produces a lower carbon footprint compared to comparable plastics and glass is recyclable.

With more particularity, the preferred embodiment uses low iron float glass such as, but not limited to, Borofloat™, produced by Shottglass, Inc. or Starfire™, manufactured by PPG. Borofloat™ is known for having a minimal thermal expansion co-efficient which makes Borofloat™ an appealing material. Other possible surface layer 20 materials include, but are not limited to, "rolled" soda lime glass and laminated float glass which may have multiple layers to provide for higher performance, higher reliability, noise absorbsion, thermal shock resistance and the like. It is known that use of one or more engineered polymer interlayers can yield glass laminates with one hundred times the stiffness and five times the strength of standard float glass. Further, the polymer layers may be ultra-violet light resistant, they are temperature stable and they provide an edge protection to the laminates. Further, it is known to print thin film electro-optics directly on polymer interlayers. The printed thin film electro optics can create the necessary photovoltaic cells 23.

For example, a laminated glass structure was used in the "Grand Canyon glass walkway" which is suspended approximately 1200 meters above the Colorado River and extends outwardly from the rim of the Grand Canyon. The individual glass layers of the "walkway" are tempered to enhance strength and the top surface has been patterned with a slip resistant coating.

In an alternative embodiment, polycarbonate might also be used for the surface layer 20.

The precise nature of the surface layer 20 is critical as the surface layer 20 will be exposed to microscopic impact stresses from road traffic, and Hertzian contact stresses generated at the surface of the surface layer 20 by sharp objects such as road grit and stones lodged in vehicle tires. Impact stresses can cause failure of the surface layer 20 and cause cracks therein, while Hertzian contact stresses may generate cone cracks in the surface layer 20 which weaken the surface layer 20 and may lead to eventual failure. Further, such damage as scratches, cracks and the like in the surface layer 20 will diminish the optical properties and optical transparency of the surface layer 20.

In the preferred embodiment, the surface layer 20 is treated to minimize susceptibility to surface damage. In one embodiment, the surface layer 20 is treated with a wear resistant coating such as, but not limited to, the diamond coated commercial float glass by Guardian® Industries. A second option is to use strengthened glass which is tempered or ion exchanged, to possess a pre-stressed compressive layer at the surface that resists impact and related contact damage. Further, strengthened glass may be textured prior to hardening to enhance traction capabilities.

With particularity, in the preferred embodiment, a laminated float glass is used for the surface layer 20 because it is strong, durable and optically transparent. Further multi-layer laminate float glass is safe and is capable of withstanding projected and anticipated impact loads for a trafficable surface.

Further, the recyclability of glass, its manufacture using plentiful raw materials and current government initiatives to lower energy costs and $CO_2$ footprint also support the use of float glass as the surface layer 20.

Carried between first upper glass panel 21 and second lower glass panel 22 is a plurality of spacedly arrayed photovoltaic cells 23, a plurality of spacedly arrayed light emitting diodes (LED's) 24 and known electric circuitry 25 for the functioning of the photovoltaic cells 23 and LED's 24. Heating element 26 is positioned between the photovoltaic cells 23 and LED's 24 and provides a means for heating the panel 19 to prevent ice and snow accumulation thereon, when the panel 19 is exposed to freezing conditions. The circuitry 25 for operating the heating element 26, the photovoltaic cells 23 and the LED's 24 pass through an orifice (not shown) defined in lower glass panel 22 to operatively connect with electrical storage device 27 and controller 28 and the like for operating the components of the panel 19.

Known photovoltaic cells 23, also known as solar cells, are most efficient when oriented directly at the sun so that solar rays strike the photovoltaic cells 23 orthogonally. Testing has reinforced this understanding, but also revealed that on overcast and cloudy days, that horizontally installed solar panels 19 generate more electricity than solar panels oriented toward the sun. It is believed this increase in electrical production is caused by the scattering and diffusion of solar rays striking moisture droplets in the air. Further, testing has revealed that automobile headlights shining on horizontally aligned solar panels 19 also generated some levels of electricity.

In the preferred embodiment, the photovoltaic cells 23 are monocrystalline solar cells that are commercially available. The monocrystalline photovoltaic cells 23, although only having an efficiency of approximately 14.47% are known to be durable, inexpensive, and are commercially available. It is recognized however that photovoltaic cells 23 having efficiency ratings in the 42% plus range are known and improvements in efficiency continue. An alternative to monocrystalline photovoltaic cells 23 is using known thin film solar cells which are formed by depositing one or more thin layers of photovoltaic material on a substrate. One benefit of thin film solar cells is that the photovoltaic material may be deposited on the substrate using known chemical vapor deposition techniques. The thin-film photovoltaic cells (not shown) are presently less expensive than monocrystalline photovoltaic cells 23, but are also less efficient in generating electricity.

Known electric circuitry 25 communicates with the photovoltaic cells 23 to allow the energy generated within the photovoltaic cells 23 to be passed to an electrical storage element 27 or to the electrical grid.

A plurality of LED's 24 are spacedly arrayed between the first upper glass panel 21 and the second lower glass panel 22 and are spacedly arrayed between the photovoltaic cells 23. The LED's 24 communicate with the controller 28 through known circuitry 25 so that selected LED's 24 may be illuminated in desirable patterns, including lines, words and the like. It is anticipated that the LED's 24 will be colored, including but not limited to yellow, and white to represent existing painted road information. A controller 28 communicating with the LED's 24 sorts signals and responsively illuminates and turns off selected LED's 24 as desired. It is also anticipated that other forms of low power illumination devices may also be used in place of LED's 24.

In the preferred embodiment, there is at least one controller 28 per panel 19 that receives signals (not shown) via known circuitry, from a central command station (not shown) which will send signals to the panel 19 and the controller 28 causing the controller 28 to illuminate selected LED's 24 to "paint" colored lines on the panel, such as to change road lane configurations. The controller 28 further allows the central command station (not shown) to monitor the status of the panels 19 such as electrical production from the photovoltaic cells 23, and also whether there might be an obstruction (not shown) on the panel 19, by means of load cells (not shown) that may be included within the solar panel 19. The addition of additional controllers 28 will increase the functionality of the panels 19.

Electronics layer 60 provides support for the surface layer 20 formed of upper glass panel 21 and lower glass panel 22. The electronics layer 60 encloses electronic components that are not carried between the upper glass panel 21 and the lower glass 22, such as circuit boards, wiring harnesses, and other circuitry (not shown) that is necessary for operation of the panel 19.

In the preferred embodiment, the electronics layer 60 is formed of recyclable materials and structural composites including, but not limited to, wood chips, recycled plastics, recycled carpets, recycled tires, and granular aggregates.

The electronics layer 60 provides a "cushioned mat" of sorts between the glass panels 21, 22 of the surface layer 20 and base 70 which provide a means for securing the panel 19 to a road bed 18. The base 70 may be made of concrete, metal, or a composite material.

Figure 3:
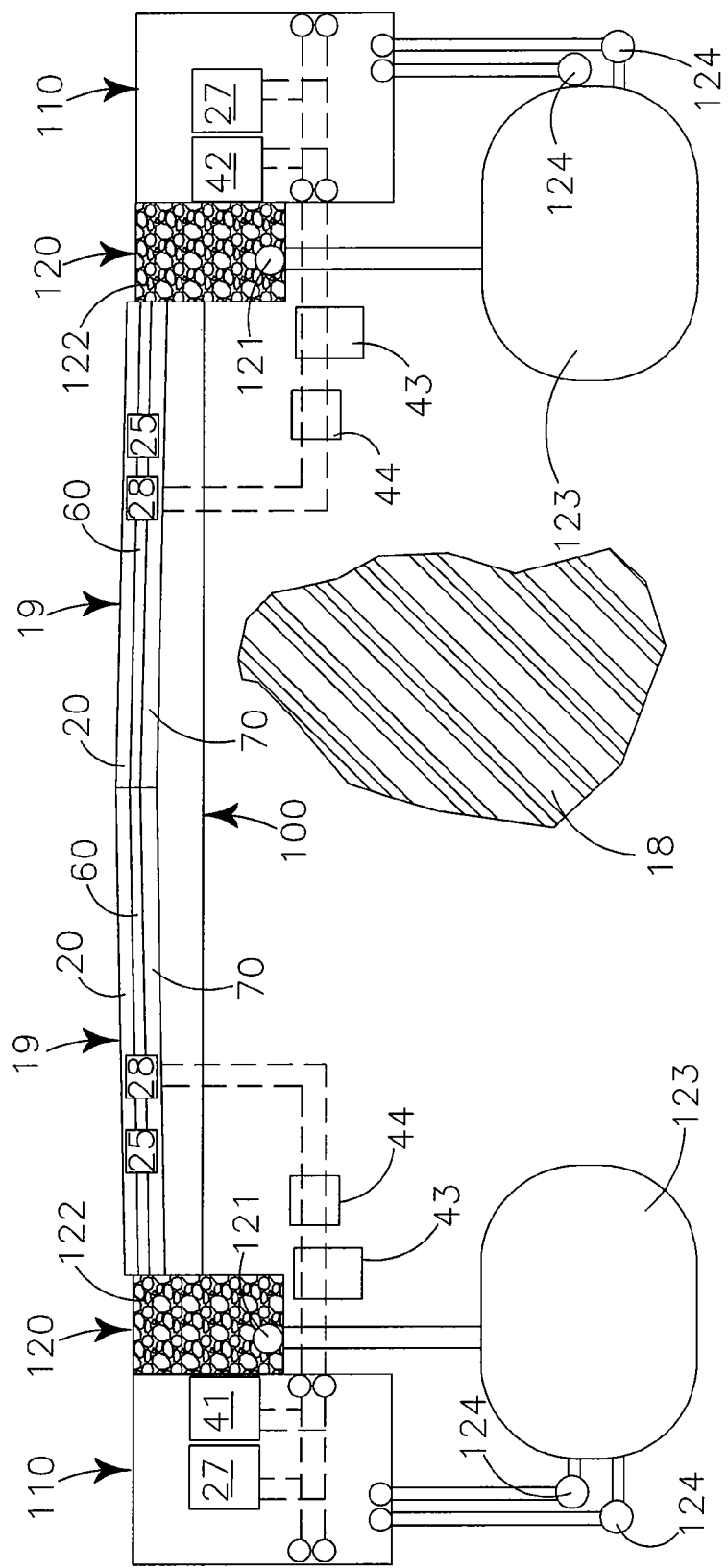
FIG. 3 is an enlarged orthographic cross section view of the solar roadway taken on line 3-3 of FIG. 2 in the direction indicated by the arrows thereon.

The base 70 essentially forms an open top box into which the surface layer 20 and the electronics layer 60 "nest". The base 70 may be formed of concrete, metal, composites or other similar material and provides spaced apart vertical lips (not shown) to retain the surface layer and the electronics layer 60 in place. The base 70 also defines a raceway (not shown) and an electrical communication conduit (not shown) which allows the panel 19 to be plugged into back plane 100 which is positioned directly underneath the base 70. (FIG. 3). The base 70 provides structural rigidity to the panel 19 and protects the panel 19 during transport and installation. The base 70 seals with the surface layer 20 to protect the enclosed electronics and provide structural rigidity to the panel 19.

In the preferred embodiment, adjacent bases 70 do not mechanically interconnect with one another, but rather are secured to the underlying pavement or asphalt with anchor bolts extending vertically therethrough and engaging with the underlying concrete/pavement so that the bases 70 are immediately adjacent one another.

In an alternative embodiment, when the solar road panels 19 are used to construct a new road that does not have underlying pavement or concrete, the bases 70 carry dowels 71 and steel plates 72 that are cast into the edges thereof. The dowels 71 and steel plates 72 provide vertical and horizontal alignment between the panels 19. In the preferred embodiment, the dowels 71 are oriented axially toward the direction of travel, while the steel plate 72 with the slotted holes 74 is oriented away from the direction of travel. Standardized alignment allows the panels 19 on adjacent lanes to be interchangeable.

Because the base 70 may be formed of concrete that is preferably wet cured to promote strength, if the panels 19 are installed on an existing road way that has been worn or otherwise degraded, it may be necessary to grind the underlying pavement flat, or add a known "fill" so that the base 70 is positioned flat and flushly against the underlying concrete and is completely supported thereon.

During daylight hours, the photovoltaic cells 23 will collect solar energy passing through the first upper glass panel 21 and convert that solar energy into direct current (DC) electrical energy through known means. The photovoltaic cells 23 communicate, by means of known electric circuitry 25 with electrical storage element 27 that is preferably a capacitor 41, but may also be a battery 42. In the preferred embodiment, a capacitor 41 is used to avoid hazardous waste byproducts of batteries 42.

The direct current (DC) energy generated by the photovoltaic cells 23 is fed into a known micro inverter 43 for conversion of the direct current (DC) energy into alternating current (AC) electricity which may be thereafter fed into the electrical grid (not shown). In the preferred embodiment, each panel 19 communicates with its own micro inverter 43 which allows each panel 19 to produce electricity independently from the other networked panels 19.

Independent operation of each panel 19 allows the solar road way system to be scalable, meaning that a few panels 19 may be purchased and installed initially and thereafter additional panels may be installed and interconnected with the system. Further, if a plurality of panels 19 is used to cover a parking lot, only those panels on which vehicles are parked would not produce energy.

The direct current (DC) energy generated by the photovoltaic cells 23 also provides energy to run the controller 28 and its circuitry as well as the LED's 24, the embedded heating element 26, and other components of the panel 19 including temperature sensors (not shown) and load sensors (not shown). Excess energy generated by the photovoltaic cells 23, over and above the amount of energy necessary for the components of the panel 19 is diverted to the electrical storage element 27, or to the electrical grid (not shown) as directed by the controller 28 and the central control station (not shown).

During night-time hours, the solar road way panel 19 is illuminated by energizing the LED's 24 embedded in the panels 19 using the energy stored within the electrical storage element 27, or by the electrical grid (not shown)

The electrical storage element 27 is preferably a capacitor 41 and more preferably an ultra capacitor that has the ability to store sufficient energy to behave similar to batteries. Cooper Bussman, Inc. is one company that is presently manufacturing such ultra capacitors 41.

Alternatively, batteries 42, or other know electricity storage devices, for instance but not limited to, flywheels, may also be used to store the generated electricity and to power the panels 19 during non-daylight hours.

Each controller 28 has a unique identification number that is capable of communicating wirelessly, or via wires (not shown) with other controllers 28 and with a central control station (not shown). Because each panel 19 interconnects with a power system and a signal distribution system, the controllers 28 are networked together forming a wide area network (WAN) which allows the central control station (not shown) to monitor real-time traffic conditions, problems and operation functions.

Figure 6:
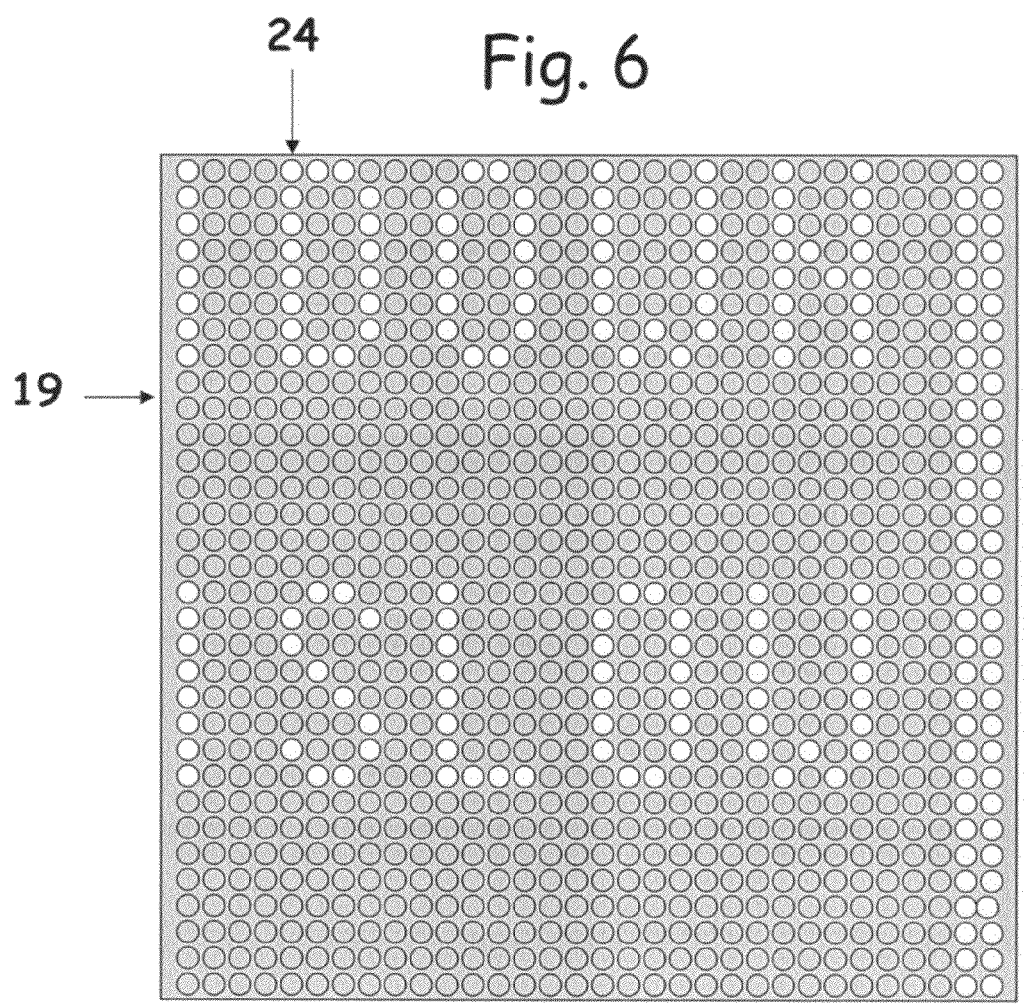
FIG. 6 is an orthographic plan view of the solar roadway panel with selected LEDs illuminated to flash the message "slowdown".
Figure 7:
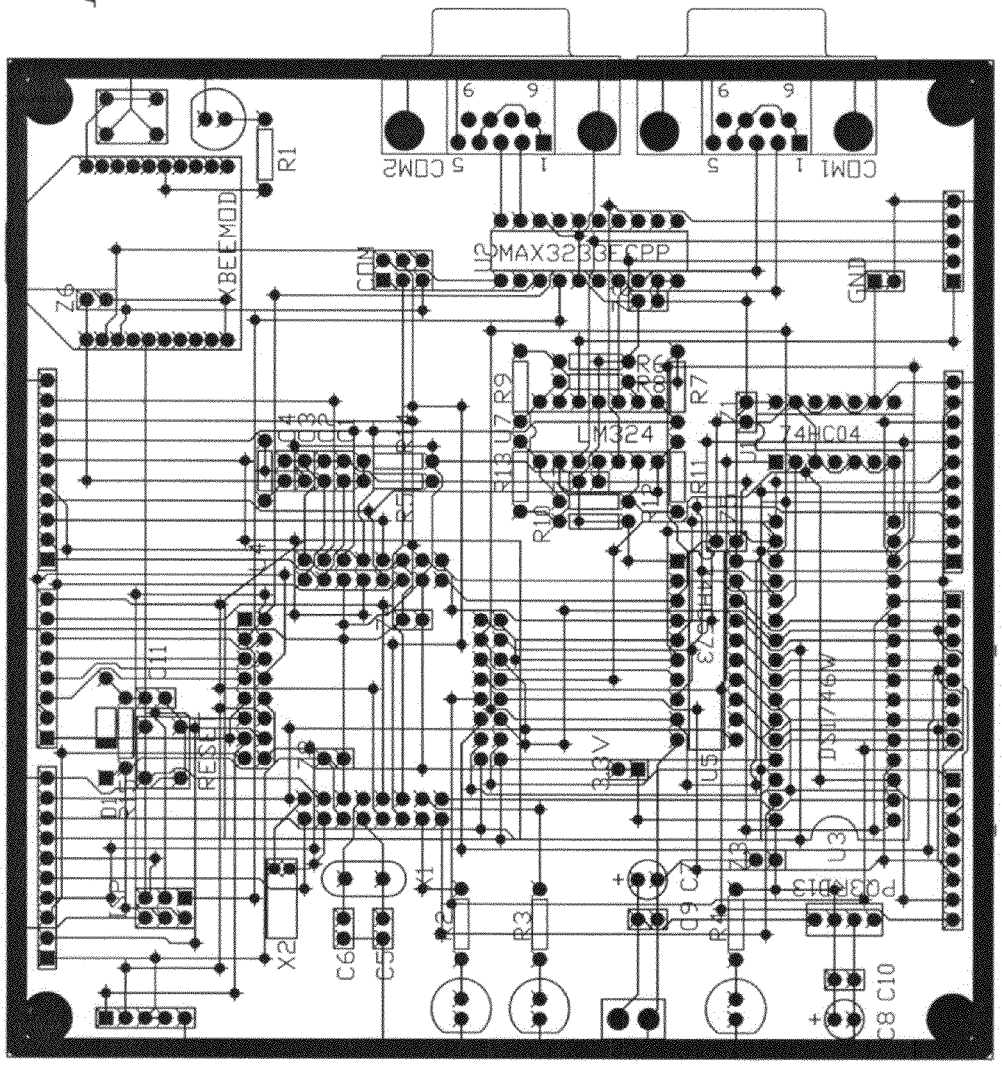
FIG. 7 is an orthographic plan view of a circuit board.

A known controller 28 (FIG. 7) controls the panel 19, including operation of the embedded heating element 26, to monitor the temperature of the panel 19, to energize the LED drivers (not shown) and to control the electrical input and output of the panel 19. Further, the controller 28 enables the panel 19 to network with adjacent panels 19 forming the WAN and also may allow, if so configured, the panel 19 to monitor vehicular traffic over the panels 19, such as with radio frequency identification tags (not shown) within the vehicles. Further, the controller 28 allows the central control station (not shown) to selectively illuminate LED's 24 embedded within the panel 19 to provide safety messages to traffic traveling on the road way, including messages such as "slow down" "caution" and the like. (FIG. 6).

In the preferred embodiment, the panels 19 are interconnected with a back plane 100 which is installed on the road bed 18 below the panels 19. (FIG. 3). Known mechanical/electrical connections are used to interconnect the panels 19 to the back plane 100. The shoulder panels 110 house the electrical grid connections and provide lateral support to the panels 19. In the preferred embodiment the back plane 100 is formed of pre-cast concrete with conduit (not shown) embedded therein for cables (not shown) to carry power to and from the panels 19 and to and from the shoulder panels 110 located at the road edge 17.

In an additional embodiment, a storm water control system 120 is installed adjacent to the solar road way to collect and transport storm water run off. (FIG. 3). The storm water system 120 collects water run-off from the panels 19 that make up the roadway. The water flows to the roadside 17 and median due to the slope of the panels 19. (FIG. 3). The storm water control 120 comprises a French drain 121 installed adjacent each side of the road way. As the run-off water filters through gravel fill 122 above the French drain 121 the particulates within the water are filtered out so that particulate free water is collected in the drain 121 and is gravity fed into underground storage tanks 123. The plumbing and tanks 123 are preferably below the frost line to prevent freezing.

Each storage tank 123 has two electric pumps 124, one to move the water in each of two possible directions to follow the road. Check valves (not shown) which are mechanical valves that allow fluid movement in only one direction, force the water to move in the desired direction. The water may be transported from the storage tanks 123 and storm water control system 120 to a water filtration facility (not shown) where it may be cleaned and thereafter transported and used as desired.

The storage tanks 123, pumps 124 and check valves (not shown) can be installed and positioned as often as needed depending upon average projected precipitation and spring runoff.

Such a storm water control system 120 will assist in remedying man-made interference with natural percolation filtration that naturally replenishes underground aquifers and the like caused by the large amount of impermeable roadway surfaces existing throughout the country.

In a further alternative embodiment, controllers 28 may use radio frequency signals to monitor radio frequency identification tags ((RFID) (not shown) carried within vehicles. Such a system would allow the road way system to monitor the movement of vehicles, and perhaps persons therein, and would provide a means for tracking business shipments, hazardous waste shipments and the like. Further, emergency vehicles having radio frequency transmitters (not shown) could broadcast signals (not shown) that are received by the controllers 28 which would thereafter activate a predetermined display of LED's 24 to let other persons traveling on the road way to know that an emergency vehicle is approaching. Similarly, the signals may be used for other law enforcement and safety purposes.

In a further embodiment, load cells (not shown) installed within the panels 19 and controlled by the controller 28 may sense when a panel 19 is driven upon by a vehicle. Since the panels 19 are networked, and the controllers 28 communicate with one another via the WAN, it is possible for the panels 19 to determine when a vehicle traveling thereon he is moving in an erratic manner, such as an impaired driver. If such an impaired driver is detected, the controllers 28 may send a signal (not shown) to the central control station (not shown) to alert the proper authorities.

In a further alternative embodiment, cameras (not shown) may be embedded in the panels 19 to take photographs of vehicles and vehicle license plates to assist law enforcement. Because the surface layer 20 of the panels 19 is transparent, the cameras (not shown) may be completely enclosed within the panel 19.

In a further alternative embodiment, the panels 19 may include known motion detectors (not shown) that operate as wildlife repelling devices, such as audio enunciating devices, or the like which are known for being effective in repelling wildlife.

Because the solar road way system will be so widespread, it is subject to a wide variety of environmental conditions including exposure to lightning strikes, and other sources of transient voltage surges that might cause damage to the solar panels 19 and the associated circuitry. The transient voltages may have high voltages carrying large amounts of energy, such as lightning strike which may cause immediate failure of the associated components. Transient voltages may also have smaller levels of energy and be caused by such things as electronic rust, but because the road way system is so extensive, the accumulative effect of small transient voltages may be significant, especially over time. Damages caused by such transient voltages may manifest themselves as unexplainable failures in electronics, corrupted data and/or corrupted programs.

To protect the solar road way system from such transient voltages plural surge protection devices 44 are integrated into the circuitry 25 of the system. Such surge protection devices 44 typically utilize metal oxide varasitors, silicone avalanche diodes, gas tubes or combinations of like or similar components as a switch for diverting excess electrical current. Known types of such surge protection devices 44 each have advantages and disadvantages, and the selection of a particular type of surge protection device 44 will be dictated by the particular circumstances and location of the road way panels 19.

It is anticipated the solar road way system will be financially self-sustaining, even though the initial cost of installing the solar road ways may be significant. It is anticipated the solar road way system once operational, will generate revenue through generation of electricity which is added to the electrical grid (not shown); by transporting storm water run-off water to usable locations; by carrying additional signals such as communications, video and the like; and by allowing persons to re-charge electric vehicles. Further, the road way panels 19 will reduce roadway maintenance costs by eliminating the need to paint lines and stripes on road way surfaces every year and by eliminating the need to plow snow and/or apply de-icing chemicals that contribute to pollution. These positive economic impacts may however be less than the global impact of reducing the need for burning fossil fuels to generate electricity which contributes to the greenhouse gas effect in the world which according to some experts is a leading cause of global warming and climate change.

As an example: estimates show that the average cost of residential electricity in the United States, for the year of 2009 averaged $0.12 per Kwh. Further, the cost of residential electricity has increased on average of 35% over the 20 year period from 1989 to 2009.

Studies further indicate that on average, each square meter of land area in the United States receives on average 4.2 Kwh of energy from sunlight every day, averaged over an entire year. Because the solar road panels 19 are 12' by 12', or 13.4 square meters, each panel 19 should receive on average 56.28 kilowatt hours of solar energy per day. Using these figures, and the rated efficiency of the prototype photovoltaic cells 23 used in the prototype which have an efficiency rated at 14.4%, calculates that each solar panel 19 would generate approximately 8.1 for Kwh of energy per day. Using the $0.12 per hour average cost of residential electricity, it is not anticipated that the solar panels 19 would, at their present levels of efficiency, fully pay for themselves over the expected useful life of 20 years. However, this estimated 8.14 Kwh of energy per day, per panel 19, may be sold back to the electrical grid (not shown) and thus generate revenue from the solar road ways which is a revenue stream compared to current existing pavement road ways that generate no revenue stream at all.

Further, our analysis indicates that increasing the efficiency of the photovoltaic cells 23 to approximately 20% would allow the solar road panels 19 to pay for themselves over their useful life expectancy of 20 years.

It is worth noting that photovoltaic cells having efficiency in the 20% plus range are commercially available at the present time, but are expensive. Further, some research and development institutions such as Boeing® have developed photovoltaic cells that have an efficiency rating exceeding 40%. Such photovoltaic cells 23 however, are not presently commercially available.

Our analysis therefore indicates that the solar road way system is economically viable and has the ability to generate revenue as well as resolve several of the aforementioned issues facing present day society and our environment.

Having thusly described our invention, what we desire to protect by Utility Letters Patent and

What we claim is:

1. A system of pedestrian and automobile traffic bearing solar panels for collecting solar energy, transforming the solar energy to electric energy, storing the electric energy, and providing the electric energy for use, comprising in combination:

a plurality of electrically interconnected pedestrian and automobile traffic bearing solar panels installed on a supportive surface so that each of the plurality of pedestrian and automobile traffic bearing solar panels has at least one edge portion immediately adjacent at least one edge portion of an immediately adjacent pedestrian and automobile traffic bearing solar panel to form a continuous planar surface for pedestrian and automobile traffic travel thereover, each pedestrian and automobile traffic bearing solar panel having;

at least one controller for communicating with neighboring pedestrian and automobile traffic bearing solar panels, and a transparent upper pedestrian and automobile traffic bearing surface, an electronics layer and a base layer all interconnected together to form the pedestrian and automobile traffic bearing solar panel, wherein the electronics layer comprises electronic components and is sandwiched between the transparent upper pedestrian and automobile traffic bearing surface and the base layer, wherein the transparent upper pedestrian and automobile traffic bearing surface comprises a first upper glass panel and a second lower glass panel and has a plurality of spacedly arrayed photovoltaic cells, a plurality of spacedly arrayed illumination devices, a heating element, and electronic circuitry therebetween, the electronic circuitry communicating with the plurality of illumination devices, the plurality of photovoltaic cells, the heating element, an electrical storage apparatus, the at least one controller and controllers within neighboring pedestrian and automobile traffic bearing solar panels for communication therebetween; and the base layer has means for mechanically interconnecting the pedestrian and automobile traffic bearing solar panel to the supporting surface for formation of a continuous planar pedestrian and automobile traffic bearing planar surface;

the at least one controller communicating with the electronic circuitry so that the at least one controller responsive to a signal received from the controller of a neighboring pedestrian and automobile traffic bearing solar panel or a remote central control station will direct electrical energy to select illumination devices of the plurality of illumination devices to cause illumination thereof, to the heating element, and to an inverter to convert direct current electricity from the photovoltaic cells to alternating current electricity for supply to an external electric power grid;

the external electric power grid communicates with each pedestrian and automobile traffic bearing solar panel to receive electrical energy from the plurality of interconnected pedestrian and automobile traffic bearing solar panels and to provide electrical energy to the plurality of interconnected pedestrian and automobile traffic bearing solar panels and;

the remote central control station communicates with the at least one controller by receiving signals from the at least one controller and providing signals to the at least one controller.

2. The system of claim 1 further comprising:
a storm water control system for collecting water run-off from the pedestrian and automobile traffic bearing solar panels and for filtering said water to remove pollutants and for directing the collected water run-off to a location remote from the pedestrian and automobile traffic bearing solar panels.

3. The system of claim 1 further comprising:
a storm water control system for collecting water run-off from the pedestrian and automobile traffic bearing solar panels and for filtering said water to remove pollutants and directing the collected water run-off to a location remote from the pedestrian and automobile traffic bearing solar panels, the storm water control system positioned adjacent to the system of interconnected pedestrian and automobile traffic bearing solar panels which are positioned at an angle to direct run-off to the storm water control system, the storm water control system having a French drain adjacent a side of the interconnected solar panels and the French drain communicates with plumbing connections to storage tanks and pumps and valves for moving the water for use.

4. The system of claim 1 wherein:
the transparent upper pedestrian and automobile traffic bearing surface has a textured upper surface to enhance traction capabilities.

5. The system of claim 1 wherein: the transparent upper pedestrian and automobile traffic bearing surface is formed of tempered ion-exchanged glass having a pre-stressed compressive layer that resists impact and contact damage.

6. The system of claim 1 wherein:
the electrical energy storage apparatus is external to the pedestrian and automobile traffic bearing solar panel.

7. The system of claim 1 wherein:
the inverter converts DC electrical energy from the photovoltaic cells to AC electrical energy for supplying the AC electrical energy to the external electric power grid.

8. The system of claim 1 wherein:
the illumination devices are Light Emitting Diodes.

9. The system of claim 1 wherein: the selected illumination devices are illuminated forming continuous lane lines for automobile traffic.

10. The system of claim 1 further comprising:
load cells within the pedestrian and automobile traffic bearing solar panels to detect loads on the upper pedestrian and automobile traffic bearing surface and the load cells provide a signal to the at least one controller within the panel, wherein the at least one controller illuminates select illumination devices within the panel and communicates with neighboring pedestrian and automobile traffic bearing solar panels to illuminate select illumination devices therein for communication of visible warning information to travelers utilizing the system of interconnected pedestrian and automobile traffic bearing solar panels.

11. The system of claim 1 wherein:
the at least one controller within each pedestrian and automobile traffic bearing solar panel controls illumination of select illumination devices and communicates information with neighboring pedestrian and automobile traffic bearing solar panels having traffic traveling upon the pedestrian and automobile traffic bearing solar panels to provide visible lane lines to pedestrians and automobile occupants.

12. A method for collecting solar energy, transforming the solar energy to electric energy, storing the electrical energy and providing the electric energy for use, comprising the steps:

positioning a plurality of pedestrian and automobile traffic bearing solar panels on a supportive surface so that at least one edge portion of each of the plurality of pedestrian and automobile traffic bearing solar panels is immediately adjacent to at least one edge portion of an immediately adjacent pedestrian and automobile traffic bearing solar panel and upper surfaces of the adjacent pedestrian and automobile traffic bearing solar panels are co-planar forming a continuous planar surface for pedestrian and automobile traffic thereover;

mechanically interconnecting the plurality of pedestrian and automobile traffic bearing solar panels to the supportive surface;

electrically interconnecting the plurality of pedestrian and automobile traffic bearing solar panels for collecting solar energy and converting said solar energy into electrical energy, each of the plurality of interconnected pedestrian and automobile traffic bearing solar panels having:
- at least one controller for communicating with neighboring pedestrian and automobile traffic bearing solar panels, and
- a transparent upper pedestrian and automobile traffic bearing surface, an electronics layer and a base layer all interconnected together to form the pedestrian and automobile traffic bearing solar panel, wherein the electronics layer comprises electronic components and is sandwiched between the transparent upper pedestrian and automobile traffic bearing surface and the base layer, and wherein
  - the transparent upper pedestrian and automobile traffic bearing surface comprises a first upper glass panel and a second lower glass panel and has a plurality of spacedly arrayed photovoltaic cells, a plurality of spacedly arrayed illumination devices, a heating element, and electronic circuitry therebetween;

the at least one controller directing the electrical energy to select illumination devices of the plurality of illumination devices within each of the plurality of interconnected pedestrian and automobile traffic bearing solar panels to provide visible pedestrian and automobile occupant useful indicia to automobile traffic and pedestrians traveling upon the system of interconnected pedestrian and automobile traffic bearing solar panels;

interconnecting an electrical energy storage apparatus with the plurality of interconnected pedestrian and automobile traffic bearing solar panels to store collected electrical energy;

interconnecting the photovoltaic cells to an inverter and with an external electric power grid to transfer electrical energy from the inverter to the external electric power grid;

interconnecting the at least one controller within each of the plurality of interconnected pedestrian and automobile traffic bearing solar panels with controllers of neighboring pedestrian and automobile traffic bearing solar panels for communication therebetween and to selectively direct electrical energy from the plurality of interconnected pedestrian and automobile traffic bearing solar panels to the external electric grid and to direct electrical energy from the external electric power grid to the plurality of interconnected pedestrian and automobile traffic bearing solar panels to illuminate selected illumination devices to provide illuminated lane lines and warnings and pedestrian and automobile occupant useful information to pedestrian and automobile traffic traveling over the plurality of interconnected pedestrian and automobile traffic bearing solar panels.

13. The method of claim 12 further comprising the step:

heating the pedestrian and automobile traffic bearing solar panel with the heating element within the pedestrian and automobile traffic bearing solar panel to prevent snow and ice from accumulating on the pedestrian and automobile traffic bearing surface.

14. The method of claim 12 wherein:

the at least one controller within each pedestrian and automobile traffic bearing solar panel communicates information with controllers of neighboring pedestrian and automobile traffic bearing solar panels so that visible information provided to pedestrians and occupants of automobiles continues from solar panel to solar panel providing continuously visible lane lines.

* * * * *